United States Patent [19]

Crooke et al.

[11] Patent Number: 4,555,765

[45] Date of Patent: Nov. 26, 1985

[54] MULTI-MODE OSCILLOSCOPE TRIGGER WITH COMPENSATING TRIGGER DELAY

[75] Inventors: Arthur W. Crooke, Concord; Edwin E. Stebbins, Boston, both of Mass.

[73] Assignee: Analogic Corporation, Peabody, Mass.

[21] Appl. No.: 418,186

[22] Filed: Sep. 14, 1982

[51] Int. Cl.[4] .................. H01J 29/56; G01R 23/16
[52] U.S. Cl. .................................... 364/571; 364/481; 364/487; 315/367; 324/121 R
[58] Field of Search ............... 364/571, 481, 486, 487; 315/367, 370; 324/121 R; 375/106

[56] References Cited

U.S. PATENT DOCUMENTS

| | | | |
|---|---|---|---|
| 4,065,664 | 12/1977 | Kristof et al. | 364/487 |
| 4,142,146 | 2/1979 | Schumann et al. | 364/487 X |
| 4,251,754 | 2/1981 | Navarro et al. | 315/367 X |
| 4,251,815 | 2/1981 | Dagostino | 315/367 X |
| 4,350,953 | 9/1982 | Best et al. | 324/121 R X |
| 4,399,512 | 8/1983 | Soma et al. | 364/487 |

Primary Examiner—Edward J. Wise
Attorney, Agent, or Firm—Stephen G. Matzuk

[57] ABSTRACT

In a sampling digital oscilloscope means operable to measure the time period from the occurrence of a trigger signal to the onset of signal sampling period so that commulatively stored samples of a repetitively sampled signal visually coincide, producing a clear, jitter-free signal image. Moreover, the trigger signal is also produced according to a hold-off mode to allow the user to evaluate the results of processing the sampled signals by the digital oscilloscope before adding new data samples. In addition, a triggered update of stored data by new signals is provided, which is further controllable via an arm/disarm control to interrupt realtime updating of signals, allowing the user to observe signal changes as they occur.

10 Claims, 4 Drawing Figures

MULTI-MODE OSCILLOSCOPE TRIGGER WITH COMPENSATING TRIGGER DELAY

FIELD OF THE INVENTION

The present invention relates to trigger circuits, and in particular, to digital oscilloscopes having sampled signals which are triggered at points independent of the sampling times.

BACKGROUND OF THE INVENTION

In simple analog oscilloscopes, the onset of the sweep is provided by a trigger signal generated in reference to a particular event, which may include the transition of a predetermined threshold by the signal to be displayed. However, in digital oscilloscopes which typically quantitized the signal at discrete periodic time intervals and store signal samples for subsequent processing and display, the relationship to the trigger time and the sample interval must be consistent for the displayed image to be free of jitter or visual distortion caused by time offset of the stored signal samples. A still more difficult problem arises when the signl is continually sampled and stored before the occurrence of a trigger signal. In such cases, it is not possible to adjust the sample interval to coincide with the trigger occurrence time. Moreover, the jitter is made worse when the signal is sparsely sampled such as at a rate near the Nyquist rate.

The importance of the alignment in time of successively sampled signals is accentuated when the stored signal samples are subsequently processed according to various mathematical processes. A simple example of processes include a weighted average or a substraction between one signal and a prior signal. In such operations, for the influence of jitter in the calculated functions causes significant error in the results produced.

BRIEF DESCRIPTION OF THE INVENTION

The present invention comprises a delay measurement circuit for use in a digital oscilloscope wherein the time interval between the trigger signal and the subsequent sample time is accurately measured. A computer or processor receives a signal and adjusts the signal according to the measured delay interval to produce a resulting digital signal to correspond in time to previously stored signal samples or to some other relative or absolute time reference. The processor provides processing of the stored signals and displays the corresponding signal on a visual display. The signal can then be processed or interpolated to include a compensating displacement so as to coincide in time with previously sampled signals. The interpolations are calculated according to mathematical procedures which include the measured trigger delay time. The interpolated signal data produces a continuously stable display. Functions such as subtraction or addition between or among variously sampled signals are then provided between actual sample signals and calculated signal samples. In this manner, oscilloscopes incorporating the present invention can achieve a virtual synchronization of the signal sample intervals and the trigger function in all measurement modes, including signals stored in a pre-trigger mode wherein the sampling and storage of the signal starts before the trigger occurs.

BRIEF DESCRIPTION OF THE DRAWING

These and other features of the present invention can be better understood by reading the following detailed description, taken together with the drawing wherein.

DETAILED DESCRIPTIION OF THE INVENTION

Figure 1:
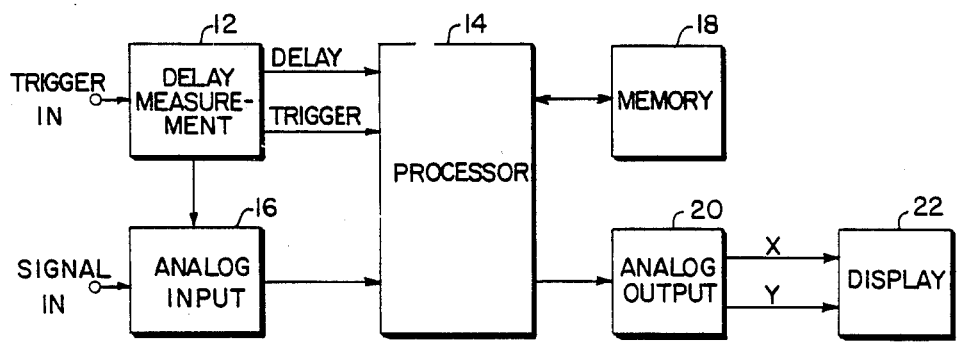
FIG. 1 is a block diagram of a digital oscilloscope incorporating the trigger compensation of the present invention.
Figure 2:
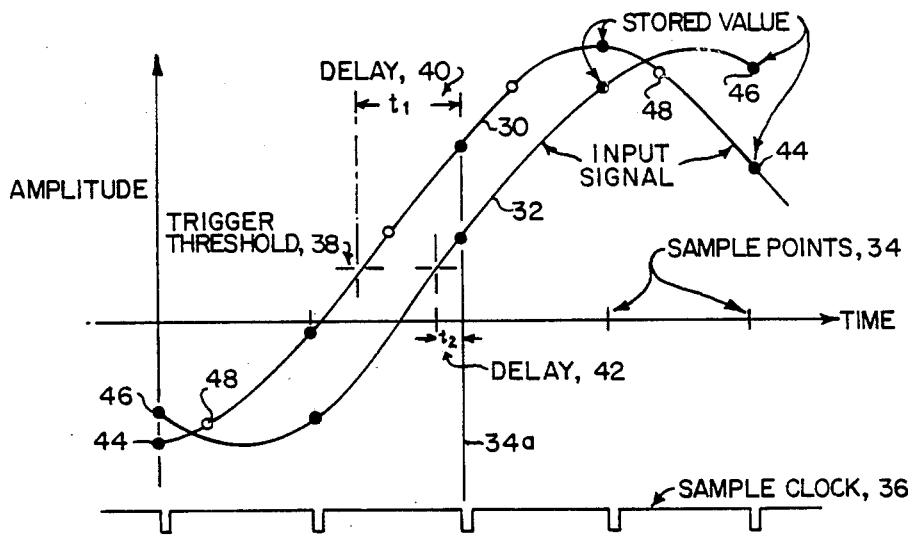
FIG. 2 is a time plot of input signals showing relative placement of sampling points and trigger threshold value.

A block diagram of a typical digital oscilloscope incorporating the present invention is shown in FIG. 1; a typical signal stored is shown in FIG. 2, with the associated sample points and trigger thresholds. The block diagram of FIG. 1 shows an oscilloscope receiving a trigger signal to initiate a selected process within the processor 14. The processor 14 also receives a input signal which has been sampled at a set sample intervals and converted to a digital signal by analog input circuitry 16, which typically includes an analog-to-digital converter. A delay measurement circuit 12 receives the trigger input and measures the time difference between the onset of the trigger signal and the subsequent sample clock. The delay measurement circuit provides a trigger signal to the processor 14 as well as the quantitized time delay value to the processor 14. The signals from the delay measurement circuit 12 and the analog input circuit 16 are received by the processor 14 for storage and subsequent conditioning and processing. The processor 14 also communicates with a memory 18 to receive and store digitized samples of the received signals. The resulting processor signals are displayed on a visual display 22 which is driven by coordinate signals provided by the analog output circuit 20, which receives display signals from the processor 14 according to the signal process performed therein.

Two representative signals received by analog input circuit 16 in FIG. 1 are shown as curves 30 and 32 in FIG. 2. The curves 30 and 32 are similar, but displaced in time so that the times of the sample points 34, as created by the sample clock 36, do not occur in the same signal position for both curves 30 and 32. In an oscilloscope which assigns all digital samples of the input signals to relative memory positions according to their relative time sequence after the transition of a trigger threshold 38, the differing time delay 40 and 42 between the crossing of the trigger threshold 80 and the sample point 43a results in different corresponding signals stored at the primary location corresponding to the respective sampling points, differing primarily from the time skew. The present invention measures the delay time 40 and 42 to adjust the waveforms 30 and 32 according to stored values 44 and 46 to allow one or both of the stored wave samples to be displaced relative to the other signal representation. For example, to cause the signal curve 30 overlay in the curve 32, interpolated values 48 are calculated and the curve 30 is displaced in time according to the difference between the delay 40 and 42 value. The interpolation is performed by an interpolation program in the processor 14; interpolation programs are generally known, and are not discussed here.

Figure 3:
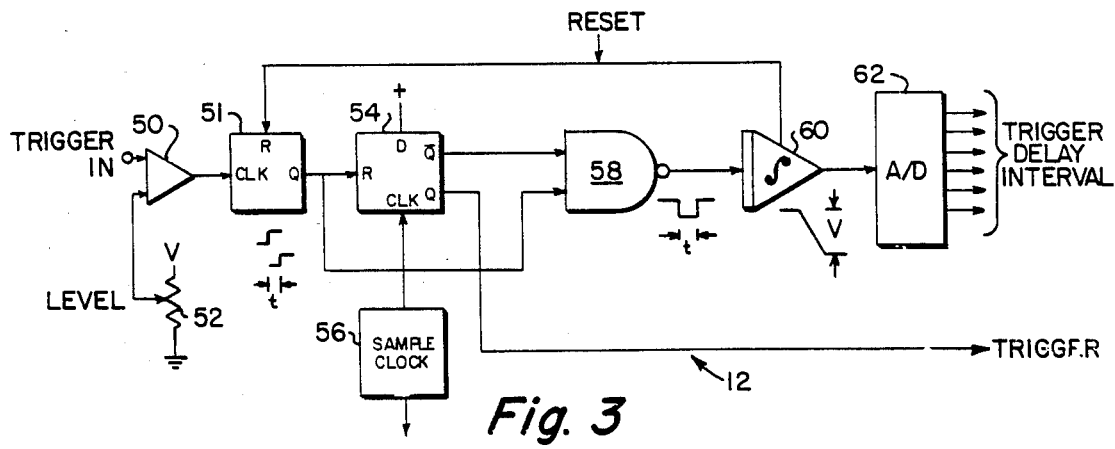
FIG. 3 shows a block diagram of an analog implementation of the delay measurement circuit of FIG. 1.

The delay measurement circuit 12 of FIG. 1 is shown in greater detail in FIG. 3. A trigger signal, which may be derived from the signal to be stored and displayed, is received by comparator 50 along with a predetermined threshold level provided by adjustable potentiometer 52, whereupon the comparator output makes a logical level transition signal received by a set/reset flip-flop 54. Prior to the comparator 50 output transition, the flip-flop 54 is reset by a signal which causes the Q and $\overline{Q}$ outputs to be in a one and zero state, respectively. The flip-flop also receives a periodic clock signal from a sample clock 56 providing an output corresponding to the sample clock signal 36 shown in FIG. 2. For sample clock signals received by the flip-flop 54 when the comparator 50 output is in the high or one state, the $\overline{Q}$ output is in a low or zero position. After the sample clock signal returns to a zero state, the flip-flop 54 is reset causing the $\overline{Q}$ and Q outputs to change to a zero and one state, respectively. When the comparator 50 output changes state to a low or zero state, the logical AND combination of two high (or one state) signals by logic circuit 58 from the $\overline{Q}$ and sample clock 56 outputs produces a pulse signal having a width corresponding to the time between the trigger transition and the sample clock transition at sample points 34 of FIG. 2. A resettable integrator 60 receives this pulse signal to convert the time duration into a voltage corresponding thereto. The voltage is then received by an analog-to-digital converter 62 providing digital signals to be received by the processor 14. Furthermore, the flip-flop 54 provides a signal to the processor 14 corresponding to the first sample point subsequent to the comparator 50 output of transition. Moreover, if there is a clock signal of frequency high enough to provide sufficient resolutions, the analog integrator 66 and A/D convertor 62 may be replaced with their digital equivalent, a digital counter receiving a gated clock signal.

The hold-off mode allows the user to evaluate the results of the oscilloscope signal processing before entering a new input signal data group or frame. Front panel program control buttons may select a live or real-time status for a signal buffer to facilitate planned comparison of time separated signals.

In addition to these controls, the triggered update of all data frames may be controlled via a front panel arm-disarm key (not shown). This key causes an interrupt of the live updating of source inputs to allow the user to study some particular signal phenomenon in real time.

Figure 4:
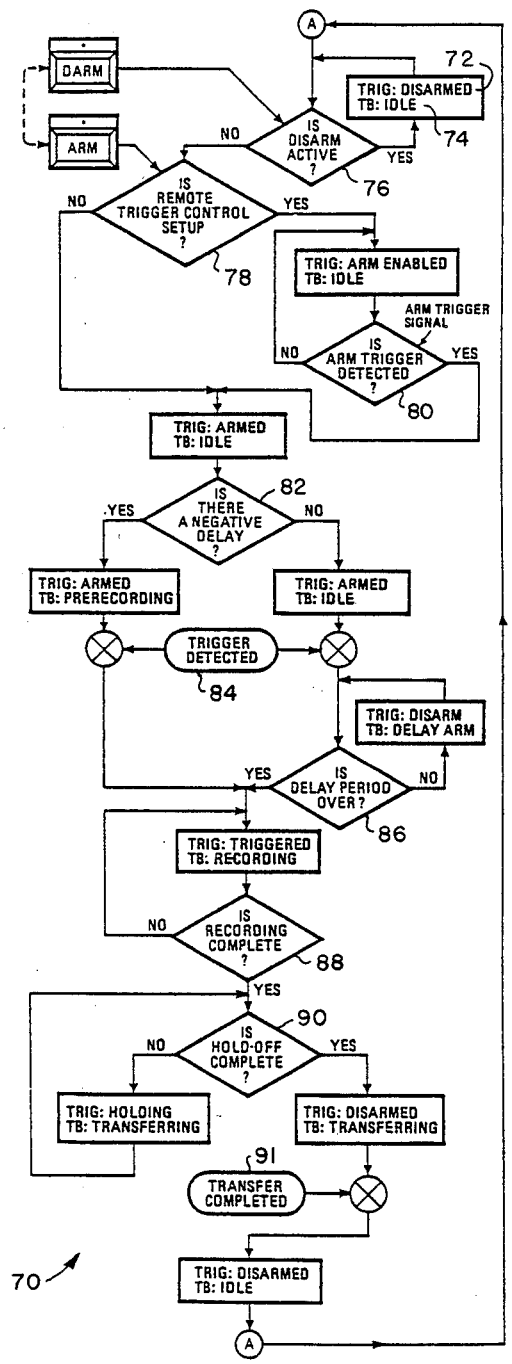
FIG. 4 is a flowchart of the trigger hold-off control process.

On the CRT display 14, the top two lines (not shown) indicate the status of the instrument with respect to its recording, storing, or transferring of updated frame information. The flowchart of FIG. 4 illustrates the correlation contained in messages that appear on these lines and the status of recording or transferring operations. The top line 72 of the status message describes the trigger status (TRIG), while the second line 74 describes the sampling or transferring status of each of the two time bases (TD).

As long as the disarm key is actuated according to step 76, no updating can take place. If the arm key (not shown) is actuated (interlocked with the disarm key), the succeeding action at step 78 depends upon whether a remote signal control of the trigger is instrumented (via an I/O communication option of the oscilloscope).

While waiting for a remote enable step 80, the display will define an armed trigger.

If a negative delay (pre-trigger signal sampling mode) has been programmed for a sampling sequence generator or time base at step 82, the instrument begins recording as soon as the trigger is armed. Otherwise, it remains idle until the trigger is valid or until the program positive delay has been completed at step 86.

When the frame recording is completed at step 88, the instrument automatically holds off the next trigger at step 90 until the updated frame data is transferred to its buffer for the next display. It will hold off the trigger for an additional delay if a hold-off time has been button-programmed as described earlier. The status lines will indicate the trigger status as holding (until the hold-off interval is completed) or disarmed (when the hold-off is either zero or completed). Then, when the transfer is completed at step 90, the time-base indication returns to OFF and the cycle starts over again.

The analog and digital signal converters discussed above, as well as particular implementation of the processor and associated memory, may be implemented by systems and techniques known in the art, and are not therefor discussed further here. Similarly, the display 22 may include any number of commercially available cathode ray tube display units, as well as other graphics devices such as a paper plotter. Moreover, the particular software and the code and language used to implement the flowchart of the present invention are well within the scope of those skilled in the art. Accordingly, modifications of the above embodiments are considered within the scope of the present invention, which is not to be limited except according to the following claims.

What is claimed is:

1. A method of synchronizing a sampling signal storage apparatus which samples an input signal at sample time intervals including the steps of:
    comparing a trigger signal to a trigger level to provide a signal transition when said trigger level is crossed;
    measuring the delay time between the signal transition of the trigger level and next said sample time interval;
    storing the delay time;
    sampling the input signal at said times intervals corresponding to said signal transition; and
    adjusting the sampled signal according to said stored delay time to provide interpolated signals samples according to said stored delay time.

2. The method of claim 1 wherein said predetermined sampling time intervals occur subsequent to said signal transition.

3. The method of claim 1 wherein said predetermined sampling time intervals precede said signal transition.

4. The method of claim 1 wherein the trigger signal is the input signal.

5. The method of claim 1, wherein said step of measuring includes:
    starting a pulse with said trigger signal;
    stopping said pulse with said sampled time interval;
    measuring the length of said pulse with an analog output signal; and
    converting said analog signal to a digital signal corresponding to said delay time.

6. Apparatus to synchronize a digital oscilloscope displaying an input signal comprising:
    a clock providing periodic sample times;

comparator means providing a trigger output signal when a trigger signal crosses a predetermined threshold;

time measuring means providing a delay signal corresponding to the time interval between said trigger output signal and a subsequent sample time;

sample means providing representative sample signals corresponding to said input signals at said sample times;

storage means for storing said representative sample signals and said delay signal; and signal adjustment means providing interpolated sample signals according to previous said sample signals and said stored delay signals, wherein the resulting said interpolated sample signals correspond to subsequent sample signals having a delay signal equal to the delay signal of said previous sample signal.

7. The apparatus of claim 6 wherein:

said signal adjustment means comprises a digital computer; and said siganl storage means comprises a digital memory.

8. The apparatus of claim 6 wherein said sample means stores said representative sample signals which occur subsequent to said trigger output.

9. The apparatus of claim 6 wherein said sample means stores said representative sample signals which precede said trigger output.

10. The apparatus of claim 6, wherein said time measuring means comprises:

pulse generation means receiving trigger output signal to start said pulse and receiving said periodic sample time to stop said pulse;

analog integrator means providing an analog output corresponding to the length of said pulse; and digital converter means providing a digital signal according to said analog output corresponding to said delay signal.

* * * * *